US012027599B2

(12) United States Patent
Baek et al.

(10) Patent No.: US 12,027,599 B2
(45) Date of Patent: Jul. 2, 2024

(54) SINGLE STRUCTURE CASCODE DEVICE AND METHOD OF MANUFACTURING SAME

(71) Applicant: POSTECH Research and Business Development Foundation, Pohang-si (KR)

(72) Inventors: Rock Hyun Baek, Pohang-si (KR); Jun Sik Yoon, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 352 days.

(21) Appl. No.: 17/387,876

(22) Filed: Jul. 28, 2021

(65) Prior Publication Data

US 2022/0085781 A1 Mar. 17, 2022

(30) Foreign Application Priority Data

Sep. 11, 2020 (KR) ........................ 10-2020-0116933

(51) Int. Cl.
*H01L 29/423* (2006.01)
*H01L 21/822* (2006.01)
*H01L 21/8234* (2006.01)
*H01L 27/088* (2006.01)
*H01L 29/06* (2006.01)

(52) U.S. Cl.
CPC .... *H01L 29/42392* (2013.01); *H01L 21/8221* (2013.01); *H01L 21/823412* (2013.01); *H01L 21/823418* (2013.01); *H01L 21/823437* (2013.01); *H01L 21/823481* (2013.01); *H01L 27/088* (2013.01); *H01L 29/0673* (2013.01)

(58) Field of Classification Search
CPC ......... H01L 29/42392; H01L 29/78696; H01L 21/8221; H01L 27/088; H01L 21/823418; H01L 21/823437; H01L 21/823481; H03F 2200/61; H03F 3/45192; H03F 3/195; H03F 3/213; H03F 3/423
See application file for complete search history.

(56) References Cited

U.S. PATENT DOCUMENTS

2021/0408234 A1* 12/2021 Huang ................ H01L 29/0653
2021/0408285 A1* 12/2021 Hickey ............ H01L 29/66545

FOREIGN PATENT DOCUMENTS

KR     1020160044793 A     4/2016

OTHER PUBLICATIONS

H.-J. Lee et al., "Implementation of High Power RF Devices with Hybrid Workfunction and Oxide Thickness in 22nm Low-Power FinFET Technology," 2019 IEEE International Electron Devices Meeting (IEDM), 2019, pp. 25.4.1-25.4.4, doi: 10.1109/IEDM19573.2019.8993647.

* cited by examiner

*Primary Examiner* — Changhyun Yi
(74) *Attorney, Agent, or Firm* — Morgan, Lewis & Bockius LLP

(57) ABSTRACT

Disclosed in a CASCODE device in which multiple transistors are stacked in a vertical direction and connected in series. The CASCODE device exhibits improvements in device/circuit intrinsic gain (GmRo) that is a performance index for analog/RF applications, cutoff frequency (Ft), and maximum oscillation frequency (Fmax). A method of manufacturing the CASCODE device is also disclosed.

17 Claims, 23 Drawing Sheets

Prior Art

Prior Art

SINGLE STRUCTURE CASCODE DEVICE AND METHOD OF MANUFACTURING SAME

CROSS REFERENCE TO RELATED APPLICATION

The present application claims priority to Korean Patent Application No. 10-2020-0116933, filed Sep. 11, 2020, the entire content of which is incorporated herein for all purposes by this reference.

BACKGROUND OF THE DISCLOSURE

1. Field of the Disclosure

The present invention relates to a single structure CASCODE device having a CASCODE circuit implemented in a single device and to a method of manufacturing the same.

2. Description of the Related Art

A metal-oxide-semiconductor field effect transistor (MOSFET) is a device including three terminals respectively called a source, a drain, and a gate. The MOSFET has an N-type semiconductor channel or a P-type semiconductor channel. There are several types of MOSFETs. For example, MOSFETs can be classified into PMOSFETs and NMOSFETs according to a semiconductor material used therefor. There is also a CMOSFET in which both the PMOSFET and the NMOSFET are included.

MOSFETs function as switches or amplifiers which are key elements used in all kinds of electronic devices that perform logic operations. For example, MOSFETs are used for computers, cell phones, and Internet of things (IOT) devices.

The development of MOSFETs shows that per-cell cost reduction, performance enhancement, and power consumption reduction have been achieved through scaling down according to Moore's law.

Existing MOSFETs for analog/RF applications are designed to have small sizes, especially small gate lengths, to increase the intrinsic gain (GmRo), cutoff frequency (Ft), and maximum oscillation frequency (Fmax). However, the short channel effect and channel length modulation effect caused by the reduction in the gate length reduce the output resistance (Ro) of the MOSFET, thereby reducing the intrinsic gain.

In order to increase the intrinsic gain of the MOSFET and improve the analog/RF performance, a CASCODE circuit in which many MOSFETs are connected in series so as to act as an amplifier is constructed.

The CASCODE circuit is a combination of a MOSFET common-source amplifier and a MOSFET common-gate amplifier. Referring to FIG. 22 which is an equivalent circuitry diagram, the CASCODE circuit includes two MOSFETS M1 and M2, each composed of a source S1/S2, a drain D1/D2, a channel C1/C2 disposed between the source S1/S2 and the drain D1/D2, a gate insulator on the channel C1/C2, and a gate G1/G2.

The CASCODE circuit exhibits a large voltage/current amplification gain provided by a common source and has excellent high-frequency characteristics provided by a common gate. However, since the CASCODE is constructed from two or more devices that are connected in series as described in Patent Document 1, the use of the CASCODE is not preferable in terms of reduction in the unit cell area.

Accordingly, in order to fabricate a single-device CASCODE, a technique in which a gate has locally different work functions and a gate oxide layer has locally different thicknesses has been proposed.

H.-J. Lee, et al. reported a single structure CASCODE device constructed as illustrated in FIGS. 23A and 23B. In order to implement a CASCODE device constructed from three transistors connected in series as illustrated in FIG. 23A, referring to FIG. 23B, a lower work function metal layer (low $V_T$ WF) with a thicker underlying oxide layer and a high worker function metal (high $V_T$ WF) with a thinner underlying oxide layer are arranged next to each other in a horizontal direction. However, this horizontal arrangement has a problem in that the gate length must be sufficiently long, which consequently increases the occupation area per cell.

CITATION LIST

Patent Literature

Korean Patent Application Publication No. 10-2016-0044793 (Apr. 26, 2016)

Non-Patent Literature

Implementation of High-Power RF Devices with Hybrid Workfunction and Oxide Thickness in 22 nm Low-Power FinFET Technology, H.-J. Lee et al., Published in: 2019 IEEE International Electron Devices Meeting (IEDM), 7-11 Dec. 2019

SUMMARY OF THE DISCLOSURE

The inventors have researched and studied on the size reduction of a CASCODE device to solve the problem occurring in the related art and thus have developed a device in which gate metals having different work functions are stacked in a vertical direction rather than a conventional horizontal arrangement, and source and drain regions respectively adjacent to the gate metals are isolated by an isolation insulating film. This enables a single device constructed multiple transistors connected in series or connected partially in series and partially in parallel.

Although technologies for manufacturing a gate-all-around (GAA) MOSFET have been advanced to a quite perfect level, there has been yet no report on the success of the fabrication of a CASCODE device based on GAA MOSFETs. To manufacture a GAA MOSFETs-based CASCODE device, it is required to develop an advanced technology for isolating source and drain epitaxial layers stacked in multiple layers from each other.

Accordingly, an objective of the present invention is to provide a single structure CASCODE device and a method of manufacturing the same.

In order to accomplish the objective of the present invention, in one aspect of the present invention, there is provided a CASCODE device including: a substrate; a plurality of channels spaced from each other and arranged on the substrate in a vertical direction; source and drain regions formed at respective sides of the plurality of channels, respectively; and a replacement metal gate disposed between each of the channels and formed by stacking multiple work function metal layers on a gate oxide layer.

The work function metal may have a multilayer structure in which the multiple work function metal layers having different work functions are stacked to correspond to a lower channel region and an upper channel region.

In addition, each of the multiple work function metals may have a different channel ratio.

The source region and the drain region are linearly arranged in a vertical direction and isolated by at least one isolation insulating film that is transversely embedded.

The source and drain regions may be linearly arranged in a vertical direction on a first side of the channel or may be arranged in a horizontal direction on the first side and a second side of the channel, respectively.

The CASCODE device may further include a metal barrier disposed between the gate oxide layer and the work function metal.

The CASCODE device may be constructed from gate-all-around (GAA) transistors connected in series.

In another aspect of the present invention, there is provided a method of manufacturing a CASCODE device, the method including: forming a plurality of channels spaced from each other and arranged in a vertical direction on a substrate; forming source and drain regions adjacent to the channels; and forming a replacement metal gate between each of the channels.

The replacement metal gate may be formed by performing an etching process to form a gate opening and to expose the plurality of channels and depositing a gate oxide layer and multiple work function metal layers between each of the plurality of channels and in the gate opening. The work function metal layers may correspond to a lower channel region and an upper channel region, respectively.

In addition, the source and drain regions may be formed to be in contact with the lower and upper channel regions through a selective epitaxial growth (SEG) process. During the formation of the source and drain regions, at least one isolation insulating film may be formed.

The single structure CASCODE device according to the present invention improves analog/RF characteristics. In addition, since the CASCODE device of the present invention has a structure in which that transistors constituting a CASCODE circuit are stacked in a vertical direction unlike a conventional structure in which MOSFETs connected in series are arranged in a horizontal direction or a CASCODE structure is implemented with one gate in which different work function regions are arranged in a horizontal direction, the CASCODE device of the present invention significantly reduces an occupation area per cell. Therefore, the CASCODE device of the present invention can be implemented in a reduced size. Moreover, since many MOSFETs can be connected in a small area, it is possible to significantly improve the intrinsic gain of the device.

In addition, with the structure in which the channels of some MOSFETs are stacked in a vertical direction to construct a CASCODE circuit, it is possible to change the effective channel width, thereby improving analog/RF characteristics.

The device manufactured by this method takes a gate-all-around (GAA) form. Therefore, the device of the present invention is suitably used for digital logic applications to replace FinFETs in the future. The device of the present invention also can be used for analog/RF applications as well as the digital logic applications. Therefore, the present invention enables the co-integration of an analog/RF application and a digital logic application in a device.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

Figure 1:
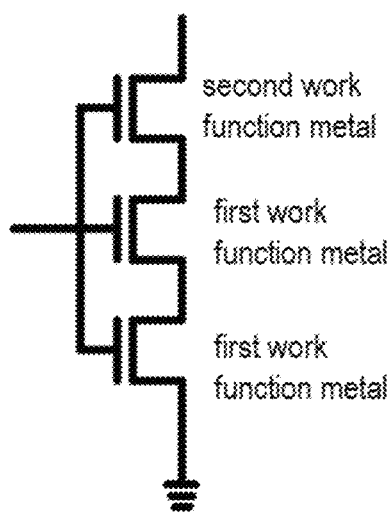
FIG. 1 is a circuitry diagram illustrating an equivalent circuit of a single structure CASCODE device according to a first embodiment of the present invention.

Above objectives, other objectives, features, and advantages of the present invention will be readily understood from the following preferred embodiments associated with the accompanying drawings. However, the present invention is not limited to the embodiments described herein and may be embodied in other forms. The embodiments described herein are provided so that the disclosure can be made thorough and complete and that the spirit of the present invention can be fully conveyed to those skilled in the art.

In the present specification, when it is mentioned that a film (or layer) is on another film (or layer) or a substrate, it can be formed directly on another film (or layer) or a substrate or formed with a third film disposed between them. In addition, the size and thickness of elements illustrated in the drawings are exaggerated for clarity. The expression "and/or" is used herein to include at least one of the elements listed before and after. Like reference numerals denote like elements throughout the specification and drawings.

The terminology used herein is for describing the embodiments and is not intended to limit the present invention. As used herein, the singular forms "a", "an", and "the" are intended to include the plural forms as well, unless the context clearly indicates otherwise. It will be further understood that the terms "comprises" and/or "comprising" when used in this specification specify the presence of stated features, regions, integers, steps, operations, elements and/or components, but do not preclude the presence or addition of one or more other features, regions, integers, steps, operations, elements, components and/or groups thereof.

The term "transistor" or "transistor device" used herein refers to a metal oxide semiconductor field effect transistor (MOSFET) and more specifically refers to a gate-all-around (GAA) MOSTFET.

Unlike a conventional art in which a CASCODE structure is implemented with multiple devices connected in series, the present invention provides several designs for a CASCODE device constructed from a single device in which a series connection or a combination of a series connection and a parallel connection is implemented.

In a first design, unlike a conventional art in which the same work function metal layer is stacked in multiple layers, there is provided a series-connected single structure CASCODE device in which two or more work function metal layers are stacked in a vertical direction so that a lower channel region and an upper channel region are matched with respectively different work functions. In this design, the number of transistors associated with each work function metal layer may vary depending on a ratio of work function metal layers in a channel region. The number of transistors connected in series may vary depending on the material of each work function metal layer.

In a second design, source and drain regions arranged in a vertical direction perpendicular to the surface of the substrate. The source and drain regions are formed through a selective epitaxial growth (SEG) process. To isolate the source region and the drain region from each other, at least one insulating film is transversely embedded therebetween. By controlling the position of each isolation insulating film and the number of isolation insulating films used, it is possible to obtain a CASCODE device in which transistors are connected partially in series and partially in parallel.

In summary, metal layers having different work functions are stacked in a multilayer form so that a lower channel region and an upper channel region have different work functions. An epitaxial structure is formed on at least one side of a channel region through a SEG process, and at least one isolation insulating film is embedded in a transverse direction in the epitaxial structure so that a source region and a drain region can be isolated by the isolation insulating film. In this way, a single structure CASCODE device in which multiple transistors are connected in series or connected partially in series and partially in parallel can be implemented. This can replace the conventional structure in which multiple MOSFETs are connected in series and each of the MOSTFETs has a single work function metal gate and source and drain regions that are arranged to be continuous in the vertical direction.

Hereinafter, the present invention will be described in more detail with reference to the accompanying drawings.

Figure 2:
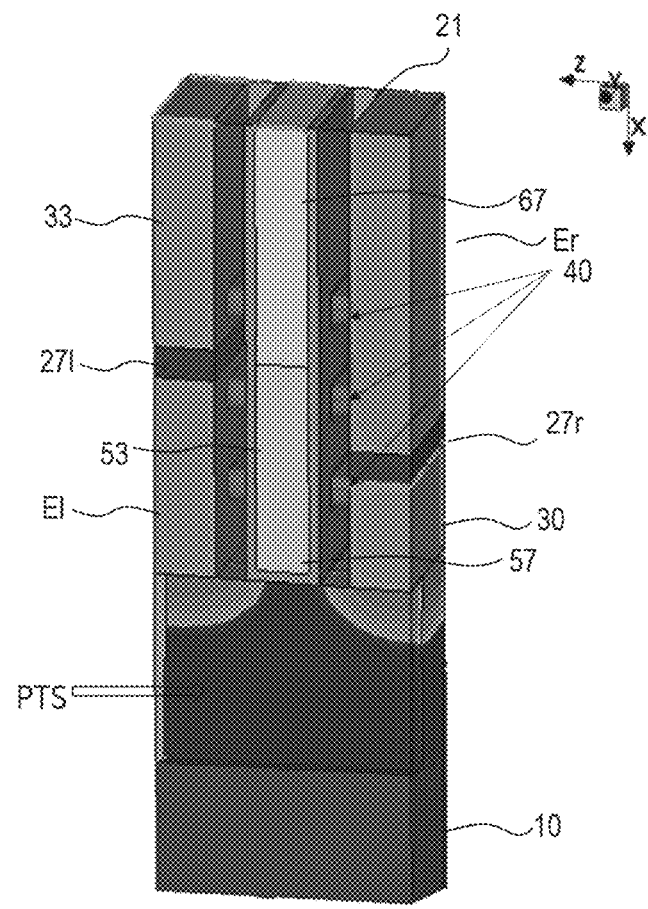
FIG. 2 is a three-dimensional cross-sectional view of the single structure CASCODE device according to the first embodiment of the present invention.

FIG. 1 is a circuitry diagram illustrating an equivalent circuit of a single structure CASCODE device according to a first embodiment of the present invention. The single structure CASCODE device is constructed from three transistors connected in series. As illustrated in FIG. 2, the device can be achieved with a structure having two different work function metal layers 1 and 2 (hereinafter, referred to as a first work function metal layer and a second work function metal layer, respectively) and two isolation insulating films.

FIG. 2 is a three-dimensional cross-sectional view of the single structure CASCODE device according to the first embodiment of the present invention. Referring to FIG. 2. the CASCODE device has a gate-all-around (GAA) MOSFET structure.

Specifically, the CASCODE device includes: a substrate 10; a plurality of channels 40 spaced from each other and arranged on the substrate 10 in a vertical direction; source and drain regions 30 and 33 formed along both side surfaces of the plurality of channels 40; and a replacement metal gate disposed between each of the plurality of channels 40 and in a gate opening. In the device, an upper portion including the replacement metal gate is filled with an insulating film, but the insulating film is not illustrated for clarity.

Hereinafter, each of the elements of the CASCODE device will be described in detail.

The substrate 10 is not particularly limited to a specific type in the present invention. A substrate selected from among various substrates that are commonly used in the related art may be used. For example, a material selected from among Si, SiGe, Ge, Sn(tin), Group III compounds, Group IV compounds, and Group V compounds to which a top-down process can be applied may be used as a substrate material. For example, Group III, IV, and V compounds include aluminum phosphide (AlP), gallium phosphide (GaP), indium phosphide (InP), aluminum arsenide (AlAs), gallium arsenide (gallium arsenide: GaAs), indium arsenide (InAs), aluminum antimonide (AlSb), gallium antimonide (GaSb), and indium antimonide (InSb).

The substrate 10 may not be doped, or may be doped with one or more n-type impurities selected from among P, As, and Sb, or one or more p-type impurities selected from among B, $BF_2$, Al, and Ga, in which the concentration of the impurities is $10^{19}$ $cm^{-3}$ or lower. The impurity introduced into the substrate 10 depends on a device type (whether it is NMOS or PMOS). Specifically, a p-type impurity is used for NMOS and an n-type impurity is used for PMOS. With such a dopant concentration range, although a high dose of impurity ions is implanted into the substrate, it is possible to suppresses the impurity ions from diffusing into the substrate even during the selective epitaxial growth process. Therefore, the impurity concentration that is initially set in the substrate can be maintained until the manufacturing of the device is finished.

In the structure of FIG. 2, only three channels 40 are present for illustrative purposes. However, the number of channels is not limited thereto. That is, N channels which are more than three may be present. In the case where three channels 40 are formed, two work function metal layers (first and second work function metal layers) are used. However, the number of work function metal layers may increase with an increased number of channels 40. For example, when the number of channels 40 is N, N−1 work function metal layers may be used. When the number of channels 40 used is N, a maximum of N transistors can be provided in a single device.

Herein, the term "lower channel region" refers to a lower portion that is close to the substrate 10 and includes the lowermost channel closet to the substrate 10, and the term "upper channel region" refers to an upper portion including the replacement metal gate formed in the gate opening.

The replacement metal gate includes a gate oxide layer 53 formed on side surfaces of the channel 40 and a work function metal layer. The replacement metal gate has a multilayer structure including a first work function metal layer 57 formed in a lower channel region and a second work function metal layer 67 formed in an upper channel region.

The channels 40 may be made of at least one material selected from among GaN, Si, Ge, SiGe, GaAS, W, Co, Pt, ZnO, and $In_2O_3$.

The gate oxide layer 53 may be at least one selected from among $SiO_2$, $Al_2O_3$, $HfO_2$, $ZrO_2$, $Si_3N_4$, and perovskite oxides, and the first and second work function metal layers 57 and 67 may be made of at least one selected from among W, Al, Cr, and Ni.

In the CASCODE device in which N channels 40 are present and two work function metal layers 57 and 67 are used, the first work function metal layer 57 is formed in at least a first channel region which is a channel region closest or adjacent to the substrate 10, and the second work function metal layer 67 is formed in a region surrounded by $N^{th}$ and $N-1^{th}$ channels. For example, in the device having three channels as illustrated in FIG. 2, the first work function metal layer 57 is formed adjacent to the substrate 10 and the first and second lowest channels, the second work function metal layer 67 is formed in the gate opening, and a double layer composed of the first work function metal layer 57 and the second work function metal layer 67 is formed adjacent to the uppermost channel.

In this CASCODE device using the first and second work function metal layers 57 and 67, some transistors have a first threshold voltage determined by the first work function metal layer 57 and the other transistors have a have a second threshold voltage determined by the second work function metal layer 67. In this CASCODE structure, a Gm region (i.e., transistor adjacent to the source region) where a voltage gain Gm is more critical and a Ro region (i.e., transistor adjacent to the drain region) where output resistance Ro is more critical are divided to maximize the intrinsic gain GmRo.

The source region 30 and the drain region 33 are connected to the multiple channels 40 and have an epitaxial structure formed through a selective epitaxial growth (SEG) process.

The SEG process is performed using at least one selected material from among Si, SiGe, Ge, Sn(tin), and Group III-V compounds. Preferably, the SEG processes uses Si. In addition, a high dose of impurity ions may be implanted, as necessary. The type of impurity ions used depends on the type of device (i.e., NMOS or PMOS). For NMOS devices, an n-type impurity is used while for PMOS device, a p-type impurity is used. For example, one or more n-type impurities selected from among P, As, and Sb may be used, ad one or more p-type impurities selected from among B, $BF_2$, Al, and Ga may be used. If necessary, in order to increase the stress effect throughout the channel 50, one or more materials selected from among Si, SiGe, Ge, Sn (tin), Group III compounds, Group IV compounds, and Group V compounds may be used.

Two isolation insulating films 27r and 27l are transversely embedded in the epitaxial structures grown by an SGM process and serving as the source and drain regions 30 and 33. Thus, each epitaxial structure is divided into separate regions isolated from each other by the isolation insulating film. For convenience of description and representation, in the drawings, a lower portion of the right epitaxial structure is denoted as the source region 30 and an upper portion of the left epitaxial structure is denoted as the drain region 33. However, the present invention is not limited thereto. The source region 30 and the drain region 33 may be linearly arranged in a vertical direction on either the left side or the right side. In this case, the source region 30 and the drain region 33 may be disposed in the lower portion and the upper portion of the epitaxial structure, respectively or vice versa. In the epitaxial structures, the remaining regions Er and El that are not used as the source region 30 and the drain region 33 for the relevant CASCODE device may be used as source/drain regions for other devices by being electrically connected to the devices. That is, the remaining regions also can serve as source and drain regions. In the representation of FIG. 2, only one region of each epitaxial structure is denoted as the source region 30 or the drain region 33 for implementation of a single structure CASCODE device.

For convenience of description and representation, although each epitaxial structure is divided into two regions to serve as the source/drain region 30/33 in FIG. 2, the number of the isolation insulating films 27r and 27l may vary depending on the number of channels 40. That is, each epitaxial structure may be divided into more than two regions depending on the number of the isolation insulating films embedded in the epitaxial structure.

In the representation of FIG. 2, the single structure CASCODE device has three channels 40 and uses two different work function metal layers 57 and 67 corresponding to a lower channel region and an upper channel region. In addition, the source and drain regions 30 and 33 are isolated from each other by the isolation insulating films 27r and 27l. That is, the CASCODE device is constructed from three transistors connected in series as represented by the equivalent circuit of FIG. 1.

Figure 3:
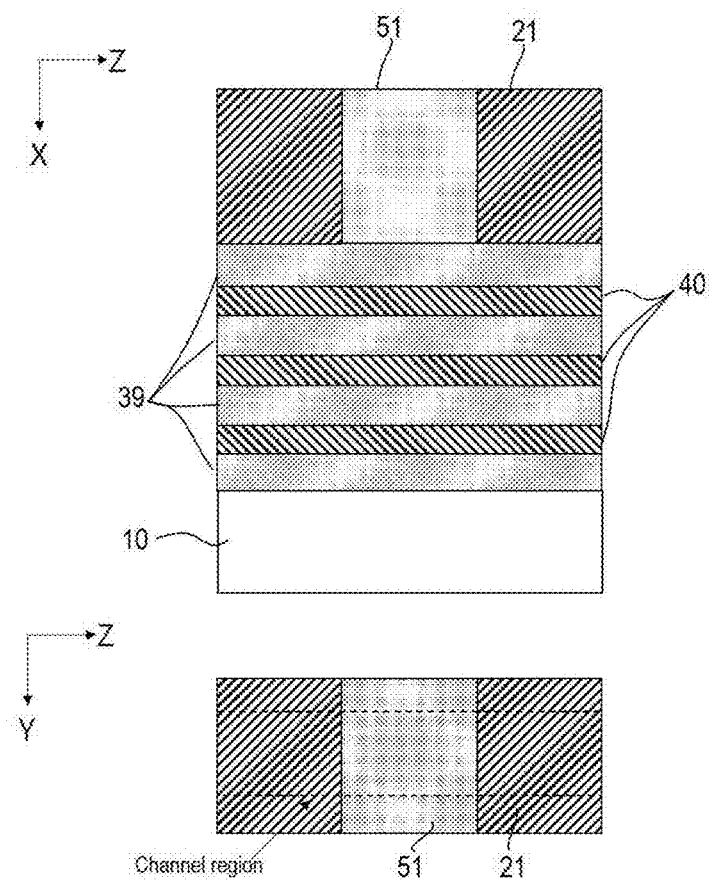
FIGS. 3 to 17 are cross-sectional views illustrating a method of manufacturing the single structure CASCODE device according to the first embodiment of the present invention.

The voids between each of the elements of the CASCODE device illustrated in FIG. 2 are filled with an insulating material (i.e., insulating film 21 as in FIG. 3). The insulating film 21 is made of one or more materials selected from among $SiO_2$, $Al_2O_3$, $HfO_2$, $ZrO_2$, $Si_3N_4$, perovskite oxides, and combinations thereof.

The single structure CASCODE device of the present invention can perform the same function as a conventional device implemented by a series connection of three transistors. However, since the CASCODE device of the present invention is implemented with a single device, it is possible to reduce the gate length and thus reduces an occupation area per cell. As a result, the device size reduction can be achieved, and the analog/RF performance can be improved.

In addition, modifications, additions, and changes to the CASCODE device illustrated in FIG. 2 are possible for the purpose of improvement of device performance and functionality. For example, the gate oxide layer 53, a metal barrier (not illustrated), and a punch-through stopper (PTS) may be added or modified.

If necessary, the gate oxide layers 53 that respectively in contact with the first and second work function metal layers 57 and 67 may have the same or different thicknesses. When the thicknesses are different, the gate oxide layer 53 in contact with the second work function metal layer 67 may be thicker or thinner than the gate oxide layer 53 in contact with the first work function metal layer 57.

In another embodiment, the gate may further include a metal barrier (not illustrated) between the gate oxide layer 53 and each of the first and second work function metal layers 57 and 67.

The metal barrier serves to reduce the stress occurring in the gate oxide layer 53 and the first and second work function metal layers 57 and 67, remove defects, and reduce leakage current. The metal barrier may be made of at least one selected from among Ti, TiN, and Al.

In a further another embodiment, a punch-through stopper (PTS) may be formed in a predetermined area under the channel 40 to effectively prevent leakage current underneath the channel 40 of the CASCODE device of FIG. 2. The PTS area is highly doped with impurity ions having an opposite conductivity to the source and drain regions 30 and 33.

As illustrated in FIG. 2, the punch-through stopper may be formed throughout the entire area under the source and drain regions 30 and 33, and the channels 40. The punch-through stopper may be formed before or after any one process described below is performed. However, since the formation of the punch-through stopper requires impurity ion injection and heat treatment, the punch-through stopper is preferably formed in the substrate 10 before the SEG process for forming the source and drain regions 30 and 33 is performed and more preferably immediately before a shallow trench isolation (STI) formation process is performed, thereby preventing the finished device from being damaged by the implantation and thermal treatment.

The CASCODE device of FIG. 2 is manufactured by forming a plurality of channels 40 stacked in a vertical direction on a substrate 10, forming source/drain regions 30 and 33 in contact with the channels 40, and forming a replacement metal gate between the channels 40.

The replacement metal gate may be formed by performing an etching process to form a gate opening and to expose the channels 40, and depositing a gate oxide layer 53 and work function metal layers 57 and 67 in the gate opening and between the channels 40. In the deposition process, multiple work function metal layers 57 and 67 having different work functions are formed to correspond to a lower channel region and an upper channel region.

In addition, the source and drain regions 30 and 33 are formed to be in contact with the lower and upper channel regions through a selective epitaxial growth (SEG) process. During the formation of the source and drain regions 30 and 33, one or more steps for forming an isolation insulating film 27r and 21l; may be performed.

More specifically, the CASCODE device of FIG. 2 is manufactured through the following steps:

a) alternately stacking, on a substrate, a plurality of channels and a plurality of spacers in a vertical direction;
b) forming a dummy gate on the uppermost channel of the plurality of channels and forming an insulating film on both side surfaces of the dummy gate;
c) removing a side surface of the channel, a side surface of the spacer, and a side surface of the insulating film in a direction perpendicular to the substrate;
d) selectively etching a portion of the side surface of each of the spacers to expose the side surface of each of the channels;
e) filling voids on the substrate with an insulating material such that the insulating material extends down to the substrate;
f) forming a lower insulating film and an upper insulating film having different heights along the side surface of the insulating film and the side surface of each of the channels such that the lower insulating film and the upper insulating film corresponds to a lower channel region and an upper channel region;
g) etching a side surface of the lower insulating film and a side surface of the upper insulating film;
h) etching the lower insulating film so that the side surface of the channel and the side surface of the insulating film are exposed;
i) forming, on the substrate, an epitaxial structure up to an upper end of the upper insulating film using a selective epitaxial growth process;
j) removing the upper insulating film and forming an isolation insulating film on the lower insulating film;
k) forming an epitaxial structure on the isolation insulating film using a selective epitaxial growth process;
l) removing the dummy gate and the spacers so that a gate opening extending down to the substrate is formed and a portion of the channels are exposed;
m) depositing a gate oxide layer on exposed surfaces; and
n) forming a multilayer metal structure including metal layers having different work functions matched with the lower channel region and the upper channel region, on the gate oxide layer.

Herein, steps f) through k) are to form the source and drain regions with the isolation insulating film interposed therebetween, and steps l) through n) are to form the replacement metal gate.

Hereinafter, a method of manufacturing a single structure CASCODE device according to one embodiment of the present invention will be described in more detail with reference to FIGS. 3 to 18.

First, a plurality of channels 39, a plurality of spacers 39, a dummy gate 51, and an insulating film 21 are formed on a substrate 10 using lithography and etching processes (see FIG. 3). Herein the dummy gate means a polysilicon gate.

The formation of the channels 40, the spacers 39, the dummy gate 51, and the insulating film 21 in a predetermined region of the substrate 10 involves a deposition process, a lithography process, and an etching process. Aside from these processes, other processes may be additionally performed. Unless otherwise stated, each layer or film is formed and processed through a sequence of deposition, lithography, and etching.

For the deposition, at least one method selected from among chemical vapor deposition (CVD), physical vapor deposition (PVD), atomic layer deposition (ALD), high density plasma CVD (HDPVD), metal organic CVD (MOCVD), remote plasma CVD (RPCVD), plasma enhanced CVD (PECVD), low pressure CVD (LPCVD), atomic layer CVD (ALCVD), atmospheric pressure CVD (APCVD), evaporation, plating, other suitable methods, and combinations thereof may be used solely or in combination thereof.

For the lithography, at least one method selected from among electron beam lithography, nanoimprint, ion beam lithography, X-ray lithography, extreme ultraviolet lithography, photolithography (steppers, scanners, contact aligners, etc.), maskless lithography, and randomly sprayed nanoparticles may be used, but the lithography process is not specifically limited thereto in the present invention. A dual photolithography process includes resist coating (i.e., spin-on coating), soft baking, mask alignment, exposure, post-exposure baking, resist development, and rinsing, drying (i.e., hard baking). Aside from these, other necessary processing may be added. Alternatively, any combination thereof may be performed.

For the etching, a dry etching process, a wet etching process, another etching process, or any combination thereof may be used. For the etching, an etching mask made of an insulating material such as $SiO_2$ or $SiN_x$, a metal Cr, Ni, or Al, or a photoresist may be used.

Specifically, a plurality of channels 40 and a plurality of spacers 39 are alternately deposited on the substrate 10, a gate material is deposited, and a photoresist film is applied on the deposited gate material. After that, a patterning process including lithography and etching is performed to form the dummy gage 51. Next, an insulating film 21 is deposed at both sides of the insulating film 21. Through all these processes, the structure illustrated in FIG. 3 is produced.

The channels 40 and the spacers 39 are alternately deposited on the substrate using the deposition process.

The channels 40 may be made of at least one material selected from among GaN, Si, Ge, SiGe, GaAS, W, Co, Pt, ZnO, and $In_2O$.

The spacers 39 may be made of at least one material selected from among $SiO_2$, $Al_2O_3$, $HfO_2$, $ZrO_2$, $Si_3N_4$, perovskite oxides, and combinations thereof, and the material of the spacers 39 may be the same as or different from the material of the insulating films 21.

In addition, the material of the spacers 39 may include an element that constitutes the material of the channels 40. However, in this case, the material of the spacers 39 and the material of the channels 40 may have different composition ratios. For example, when the channels 40 are made of silicon (Si), the spacers 39 may be made of silicon germanium ($Si_{0.7}Ge_{0.3}$).

After a gate material is deposited on the uppermost spacer 39, the gate material is patterned through the lithography and etching so that the dummy gate 51 is formed. Next, the insulating film 21 is deposited on both sides of the dummy gate 51.

The dummy gate 51 may be a polysilicon gate, a highly doped polysilicon gate, or a silicide gate. Any of the exiting gates can be used as the dummy gate 51. The polysilicon gate (i.e., dummy gate) is be removed in a subsequent process and replaced with a replacement metal gate.

Figure 4:
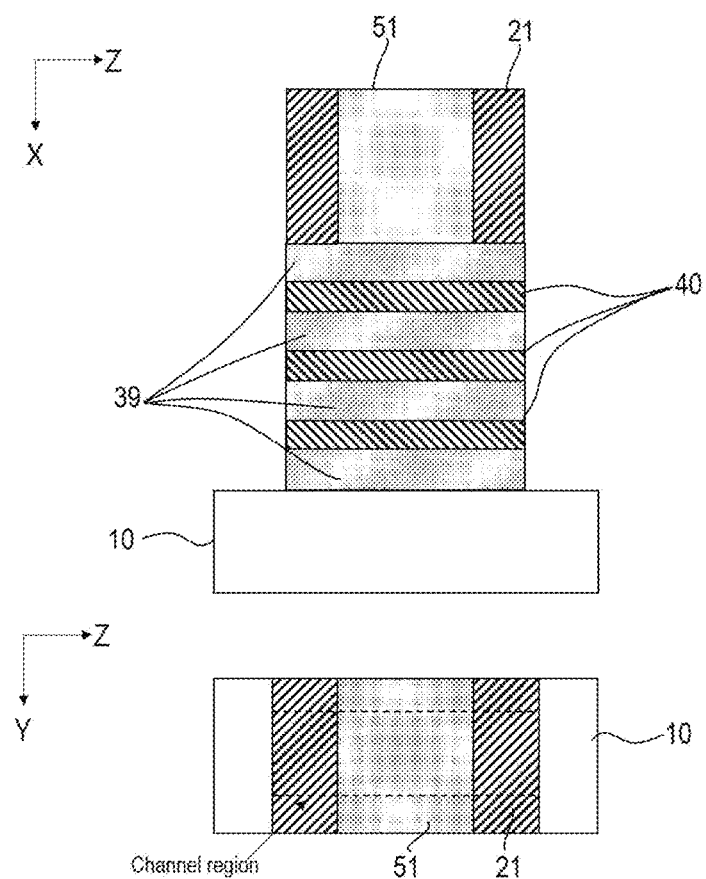

Next, in order to form the source and drain regions 30 and 33, the side surfaces of the channels 40, the spacers 39, and the insulating film 21 stacked on the substrate 10 are partially removed (see FIG. 4). This removal process involves lithography and etching.

Figure 5:
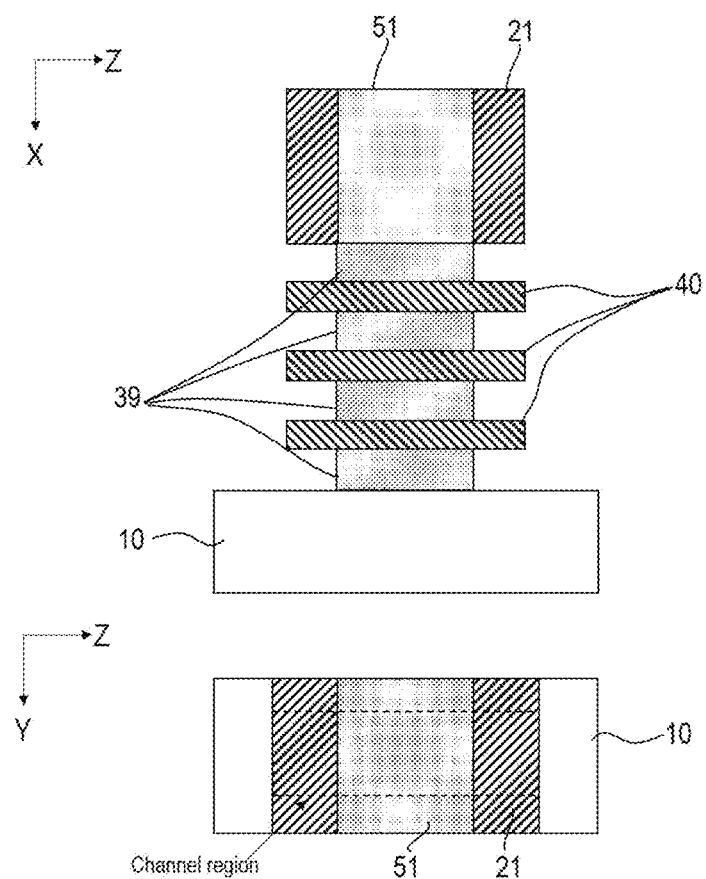

Next, the side surfaces of the respective spacers 39 are partially selectively etched so that the side surfaces of the respective channels 40 are exposed (see FIG. 5).

In this case, a region in which the spacers 39 are etched ranges from the substrate 10 to a lower end of the insulating film 21.

During the selective etching of the spacers, it is required that only the exposed spacers 39 are selectively etched. This can be achieved by controlling an etching selectivity which is a difference in etching rate between the material of the channels 40 and the material of the spacers 39. Therefore, the materials of the spacers 39 and the channels 40 are selected to exhibit an etching selectivity. In order to remove performance deterioration factors such as irregular surface state density on a to-be-etched surface during the etching process, a film growing process and a wet etching process may be additionally performed.

Figure 6:
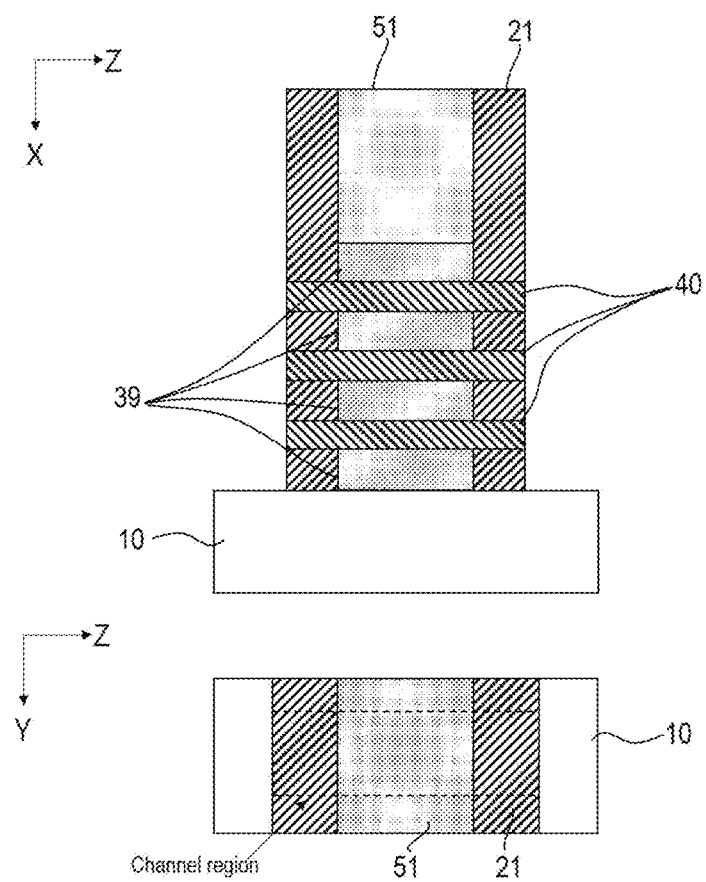

Next, the formed voids are filled with the insulating film 21 such that the insulating film 21 extends from the top to the surface of the substrate 10 (refer to FIG. 6).

The insulating material used to fill the voids is preferably the same material as the insulating film 21 as described above. Alternatively, any other known insulating material may be used. In this case, the filling process may be a deposition process such as atomic layer deposition (ALD), chemical vapor deposition (CVD), plasma enhanced-ALD (PE-ALD), or PE-CVD. The insulating material is formed such that the side surfaces of the channels 40 remain exposed after the filling is performed.

Next, an insulating material is deposited on the substrate 10 to cover the side surfaces of the channels 40 and the side surfaces of the insulating film 21. This process is to form the lower insulating films 23l and 23r and the upper insulating films 25l and 25r. In the process, the lower insulating films 23l and 23r and the upper insulating films 25l and 25r are formed to have an etching selectivity (see FIG. 7).

The lower and upper insulating films 23l, 23r, 25l, and 25r are used to form the source and drain regions 30 and 33 in the subsequent processes. The lower and upper insulating films 23l, 23r, 25l, and 25r may have different heights.

The different heights can be achieved using a method described below.

Figure 7:
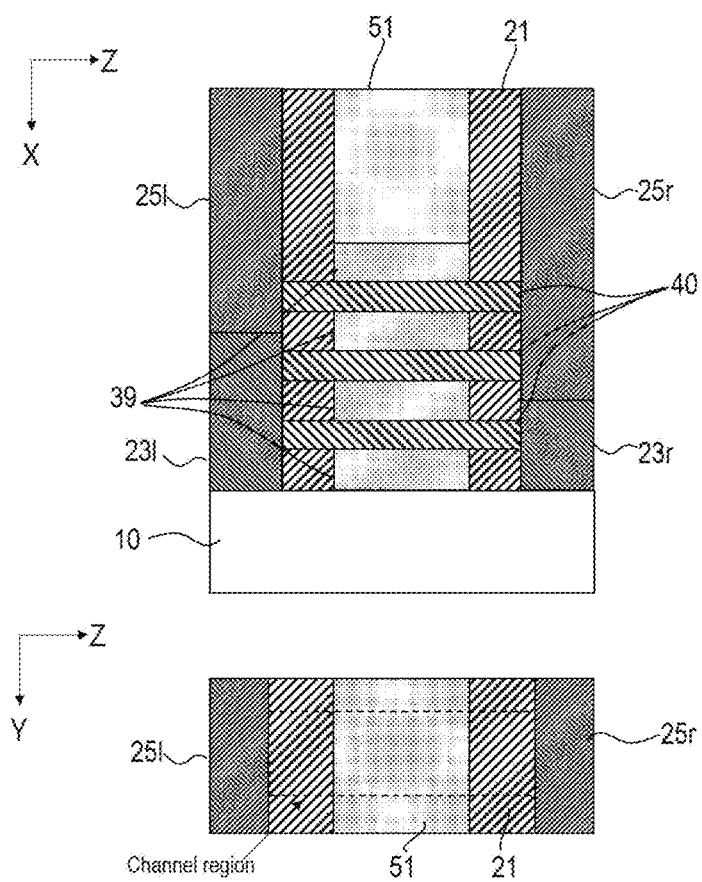

A first insulating material is deposited on the substrate 10 to form a lower insulating film 23. Next, as illustrated in the drawings, the insulating film on the left side or the right side is partially etched. In the case of FIG. 7, the lower insulating film on the right side (to be source region) is etched. In this way, the lower insulating films 23l and 23r having different heights are obtained.

Next, a second insulating material is deposited on the lower insulating films 23l and 23r so that the upper insulating films 25l and 25r having different heights are formed on the lower insulating films 23l and 23r, respectively. Thus, all of the upper and lower insulating films 23l, 23r, 25l, and 25r have different heights.

Preferably, in FIG. 7, the lower right insulating film 23r corresponds to a position where the source region 30 will be formed later, and the upper left insulating film 25l corresponds to a position where the drain region 33 will be formed later.

The material of the upper insulating films 25r and 25l may be different from the material of the lower insulating films 23r and 23l. The lower and upper insulating films 23r, 23l, 25r, and 25l may be made of at least one selected from among $SiO_2$, $Al_2O_3$, $HfO_2$, $ZrO_2$, $Si_3N_4$, perovskite oxides, and combinations thereof. The method of forming the lower and upper insulating films 23r, 23l, 25r, and 25l may be the same as the method of forming the insulating film 21, or any method mentioned in connection with the insulating film 21 may be used.

Figure 8:
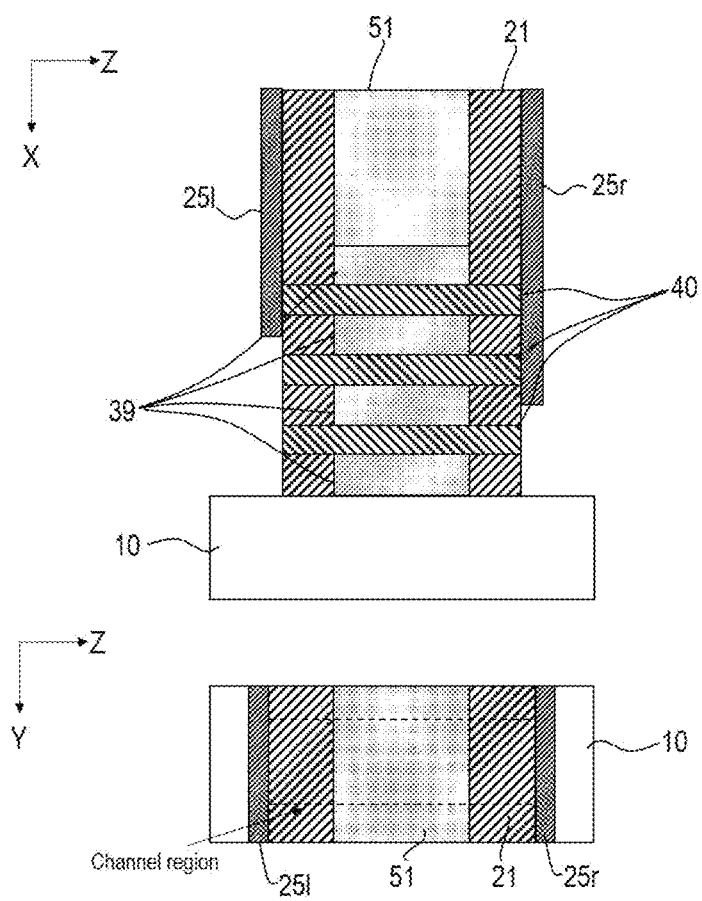

Next, to prepare for formation of the source and drain regions, the side surfaces of the lower and upper insulating films 23r, 23l, 25r, and 25l are all etched such that the thicknesses of the respective lower and upper insulating films 23r, 23l, 25r, and 25l are reduced (see FIG. 8).

Figure 9:
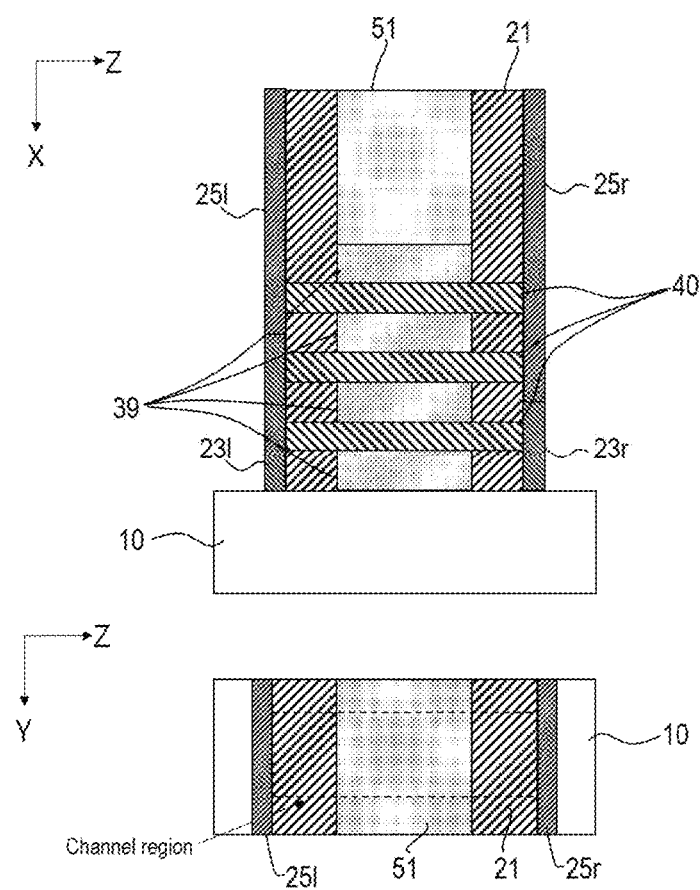

Next, the remaining lower insulating films 23r and 23l are selectively etched so that the side surfaces of the channels 20 and the side surfaces of the insulating film 21 are exposed (see FIG. 9).

Figure 10:
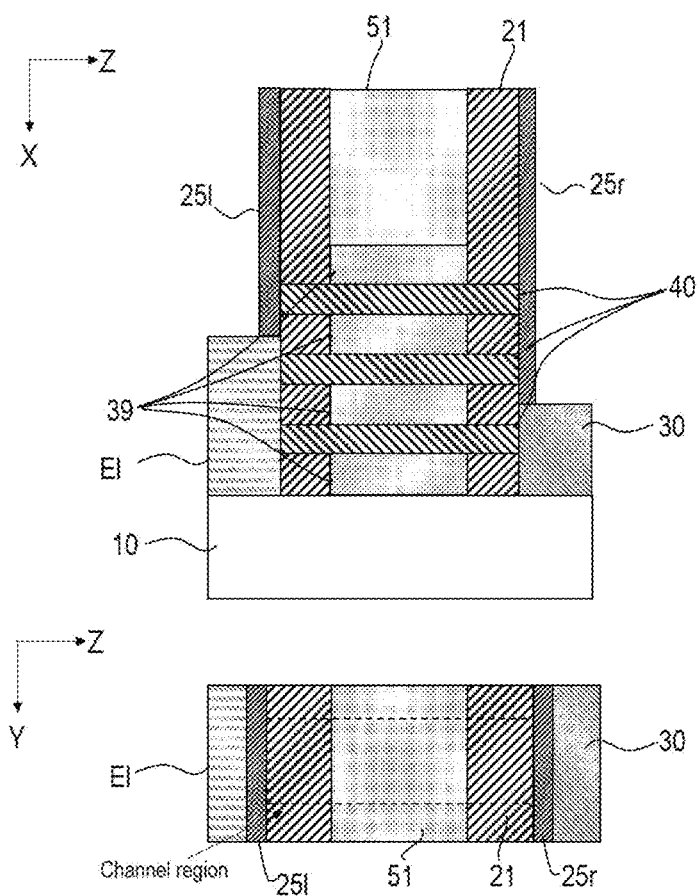

Next, a selective epitaxial growth process is performed to form epitaxial structures in the respective exposed regions of the substrate 10 (see FIG. 10).

The epitaxial structures are grown to reach the lower ends of the respective upper insulating films 25l and 25r.

At least one of the epitaxial structures may serve as the source region 30 of the CASCODE device, and the other epitaxial structure El may serve as a source region or a drain region of another CASCODE device. For example, in the representation of FIG. 2, the epitaxial structure on the right side becomes the source region 30.

Figure 11:
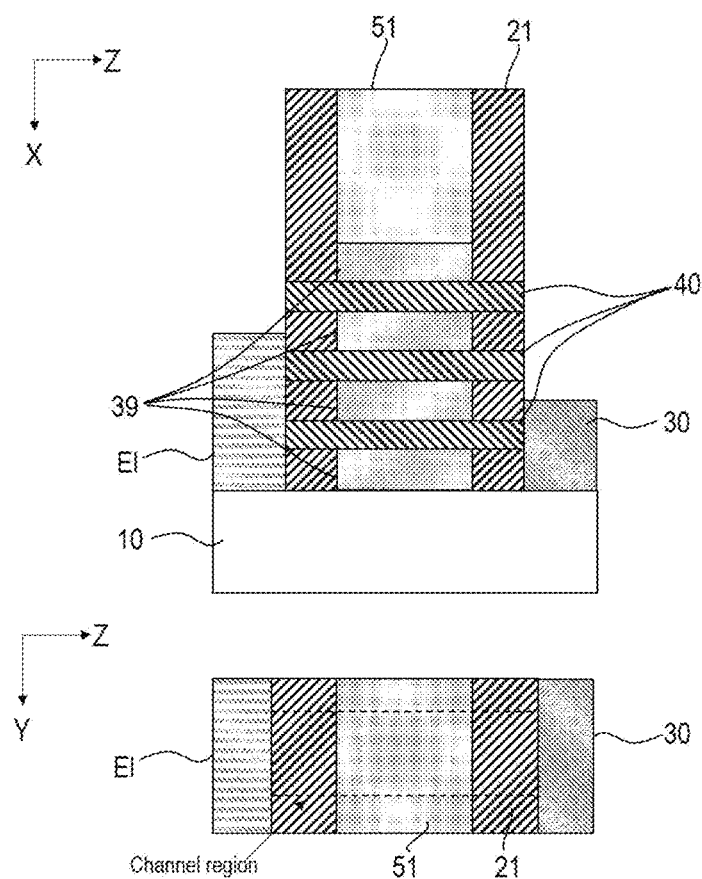

Next, the upper insulating films 25l and 25r are removed (see FIG. 11).

The removal of the upper insulating films 25l and 25r is performed using an etching process. In this case, the same etching process as described above may be used.

Figure 12:
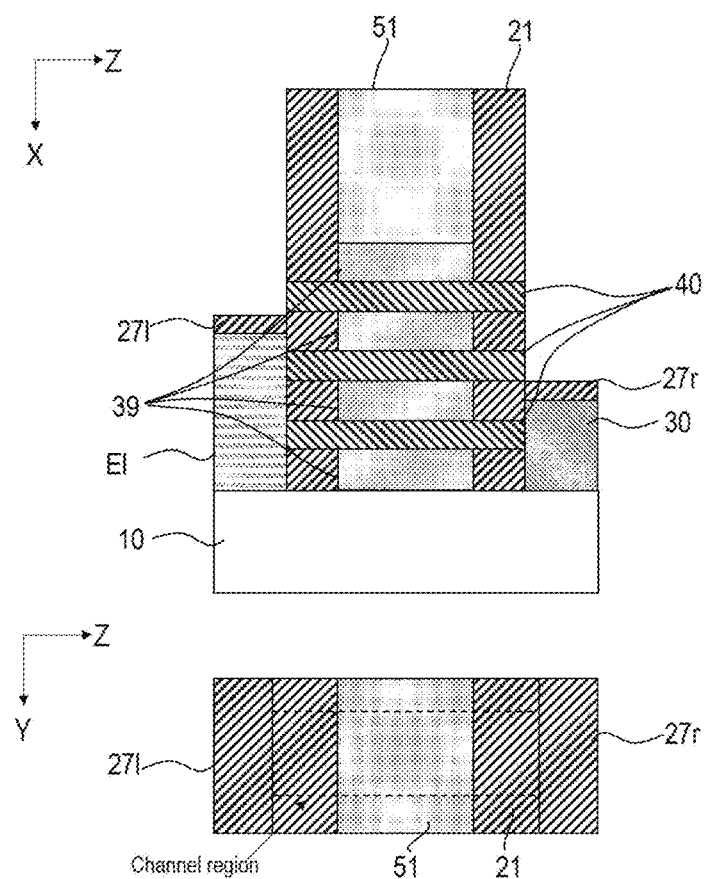

Next, isolation insulating films 27l and 27r are respectively formed to contact the source/drain regions 30 and 33 (see FIG. 12).

The isolation insulating films 27l and 27r may be formed by the method used to form the insulating film 21 or by any method mentioned above in connection with the insulating film 21.

The isolation insulating films 27l and 27r enable the fabrication of a single structure CASCODE device by allowing the source and drain regions 30 and 33 are linearly stacked in the vertical direction.

Figure 13:
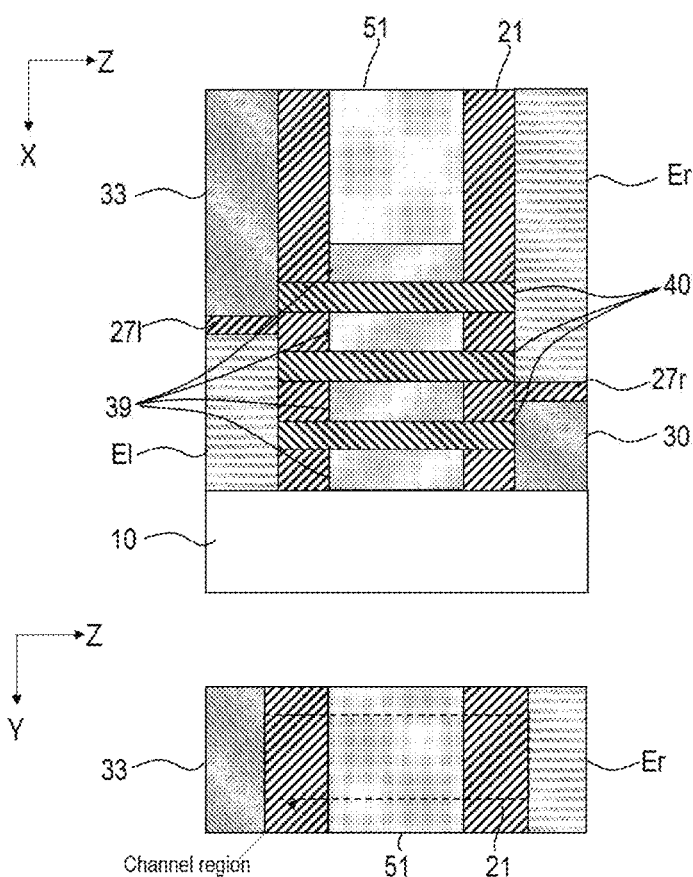

Next, a selective epitaxial growth process is performed on the isolation insulating films 27r and 27l to form epitaxial structures extending up to the upper end of the gate associated with the channels 40 (see FIG. 13).

One of the epitaxial structures may serve as the drain region 33, and the other epitaxial structure Er may serve as a source region or a drain region of another CASCODE device. For example, in the structure of FIG. 2, the epitaxial structure on the right side becomes the drain region 33.

Referring to FIG. 13, in the structure with the plurality of channels 40, the source region 30 positioned in a lower channel region is in contact with multiple lower channels 40, and the drain region 33 positioned in an upper channel region is in contact with other multiple channels 40. The source and drain regions 30 and 33 are positioned at different heights and are independently connected to the channels 40. This structure is distinguished from the structure of a conventional field effect transistor. That is, a conventional field effect transistor has one source/drain region in common contact with multiple channels.

Figure 14:
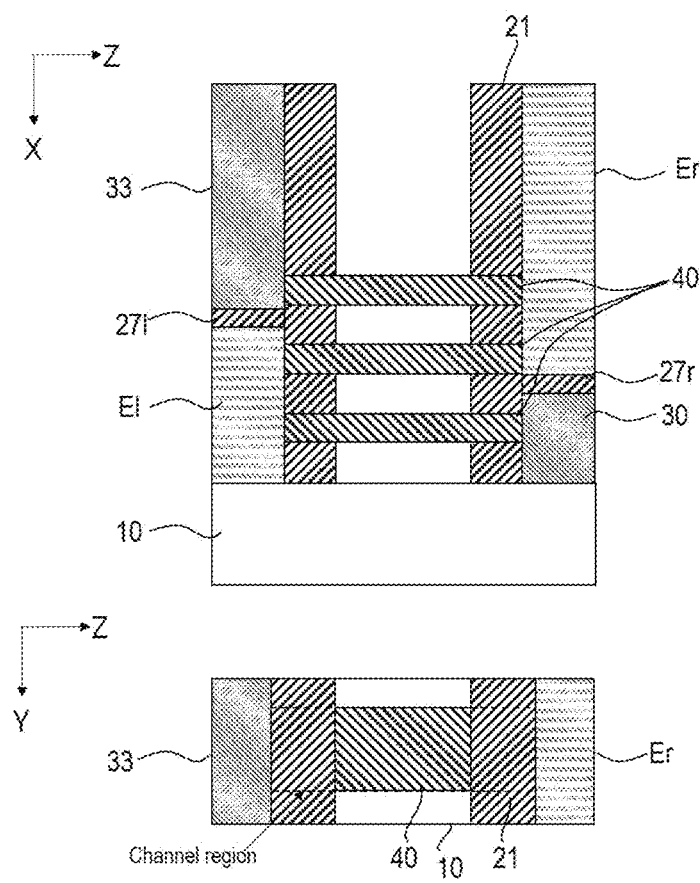
Figure 15:
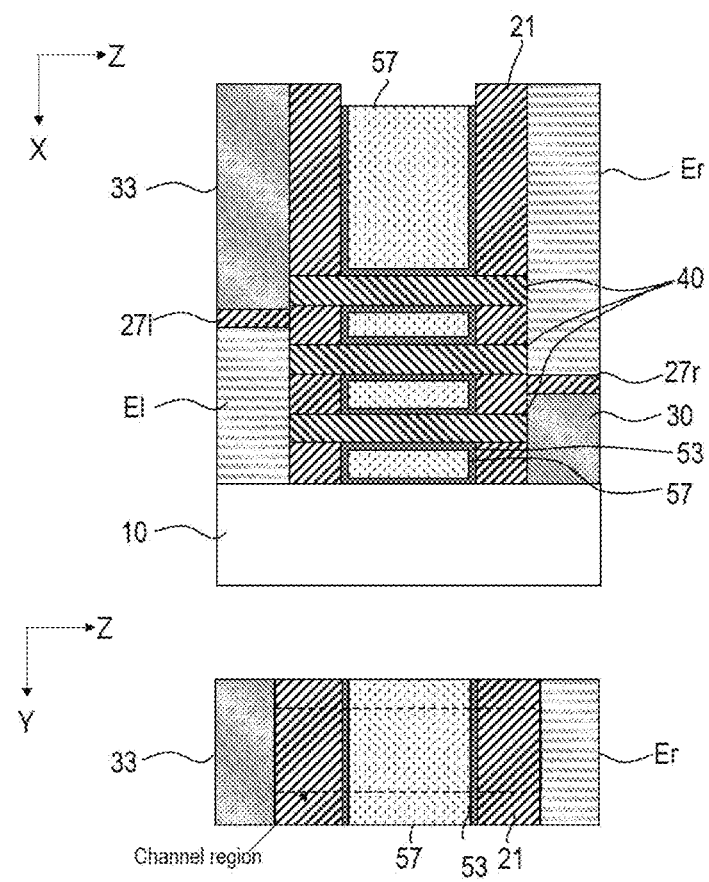

Next, an etching is performed to remove the dummy gate 51 and the spacers 39, thereby forming a gate opening and exposing a portion of the channels 40 (see FIG. 14).

As a result, a gate-all-around structure in which the channels 40 are surrounded by a gate is formed. This structure suppresses the short channel effect, thereby inhibiting leakage current. In addition, the structure allows an increased gate width which increases the ability to drive the CASCODE device.

Next, a gate oxide layer 53 and a first work function metal layer 57 are sequentially formed on the exposed surface to form a replacement metal gate.

Thus, a first work function metal layer 57 is stacked on a gate oxide layer 53. Optionally, a metal barrier may be formed between the gate oxide layer 53 and the first work function metal layer 57.

Figure 16:
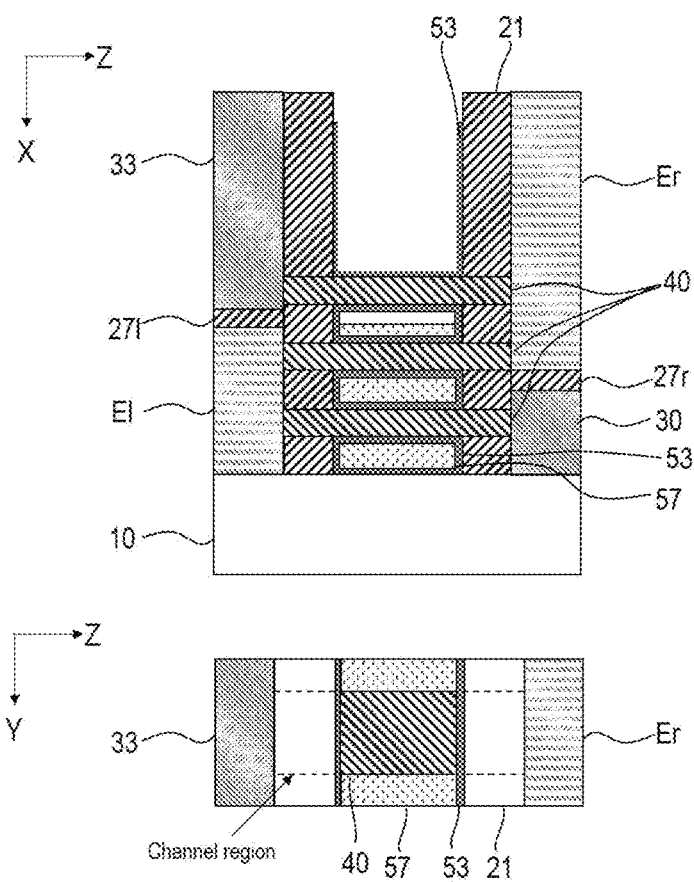

Although not illustrated in FIG. 16, a process of reducing or increasing the thickness of the gate oxide layer 53 in the lower channel region may be performed. The process involves: removing a portion of the first work function metal layer 57 formed in the gate opening and on the uppermost channel 40; and etching a portion of the gate oxide layer 53 or depositing an oxide material on the gate oxide layer 53 in the lower channel 40 region to reduce or increase the thickness of the gate oxide layer 53 in the lower channel 40 region. Next, a gate oxide material is deposited in the upper channel 40 region. This process makes the gate oxide layer 53 in the lower channel 40 region thinner or thicker than the gate oxide layer 53 in the upper channel 40 region.

The etching of the gate oxide layer 53 may be performed after the metal barrier is deposited. Next, another metal barrier may be deposited in the etched area. Through this process, the thickness of the metal barrier in the lower channel 40 region becomes larger or smaller than the thickness of the metal barrier in the upper channel 40 region.

Figure 17:
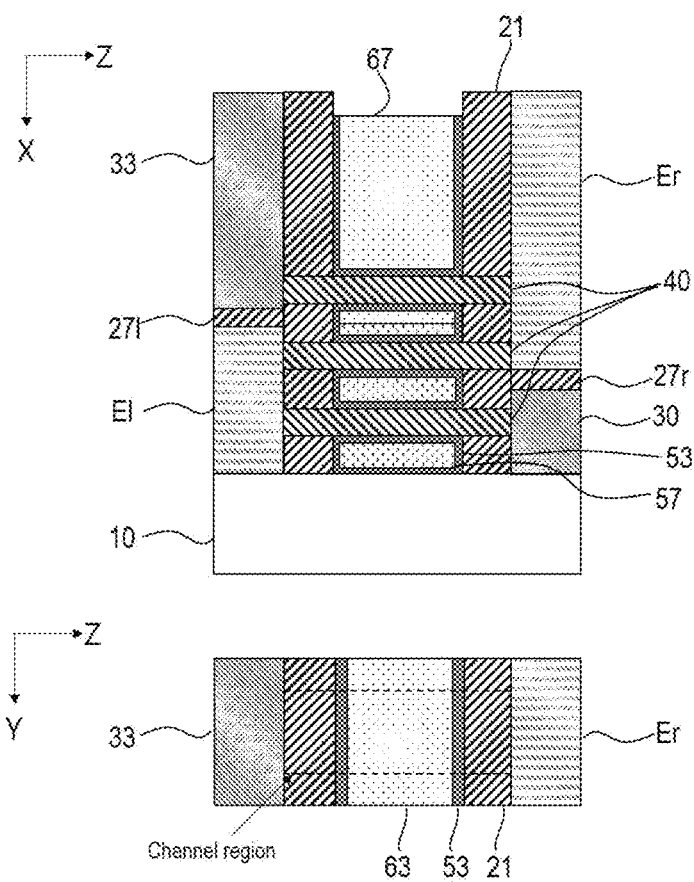

Next, a second work function metal layer 67 is deposited in the upper channel region and in the gate opening to form a replacement metal gate (see FIG. 17).

Unlike the structure of a conventional field effect transistor, in the structure of FIG. 17, the first work function metal layer 57 and the second work function metal layer 67 are stacked in a vertical direction, the source and drain regions 30 and 33 are isolated by the isolation insulating film 27r/27l.

As a result, compared to a conventional CASCODE device in which transistors are connected in series or work function metal layers are arranged in a horizontal direction, the CASCODE device of the present invention has a reduced gate length and a reduced occupation area. Furthermore, the isolation insulating films 27l and 27r solve the problems caused by the short channel effect and the channel length modulation.

Therefore, as shown in the equivalent circuit of FIG. 1, the threshold voltages of some transistors are determined by the two work function metal layers 57 and 58 (i.e., first and second work function metal layers 57 and 58) and the threshold voltages of the other transistors are determined by one work function transistor 57/67. The CASCODE device has a Gm region where a voltage gain Gm is more critical and a Ro region where output resistance is more critical, thereby maximizing the intrinsic grain GmRo. The Gm region includes a transistor adjacent to the source and the Ro region includes a transistor adjacent to the drain.

In one embodiment of the present invention described above, the single structure CASCODE device has a gate-all-around (GAA) structure. Alternatively, the single structure CASCODE device of the present invention may have a multi-gate structure such as a tri-gate FinFET or a double-gate FinFET. In addition, by adjusting the number of channels 40 included in the CASCODE device to N, it is possible to drive a maximum of N transistors connected in series at a time. Alternatively, some of the transistors may be connected in parallel to improve analog/RF characteristics. If necessary, the device performance can be optimized by using a plurality of (more than two) work function metal layers, instead of two work function metal layers 1 and 2.

Figure 18:
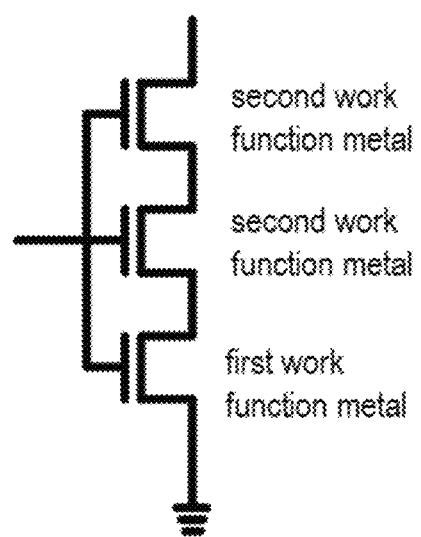
FIG. 18 is a circuitry diagram illustrating an equivalent circuit of a single structure CASCODE device according to a second embodiment of the present invention.

FIG. 18 is an equivalent circuitry diagram of a CASCODE device according to one embodiment of the present invention. This CASCODE device includes three transistors that are connected in series. This CASCODE device uses multiple work function metal layers and the number of transistors associated with each of the multiple work functions metals may be different.

In the equivalent circuit of FIG. 1, two work function metal layers (i.e., a first work function metal layer and a second work function metal layer) are used. The first work function metal layer is associated with two transistors, and the second work function metal layer is associated with the remaining one transistor. Unlike the circuit of FIG. 1, in the equivalent circuit of FIG. 18, the first work function metal layer is associated with one transistor, and the second work function metal layer is associated with two transistors.

The CASCODE device corresponding to the equivalent circuit of FIG. 18 has a structure in which a ratio of work function metal layers in a channel region differs between lower channel region and an upper channel region.

The expression "a ratio of work function metal layers in a channel region differs" means that the number of transistors associated with the second work function metal layer and the number of transistors associated with the first work function metal layer in a channel region are different from those in another channel region. For example, referring to FIG. 21, in the first lowermost channel, the first work function metal layer is formed, while in the second lower most channel, the first work function metal layer and the second work function metal layer are stacked. On the other hand, in the CASCODE device of FIG. 2, in the second lowermost channel, only the first work function metal layer is formed.

Figure 19:
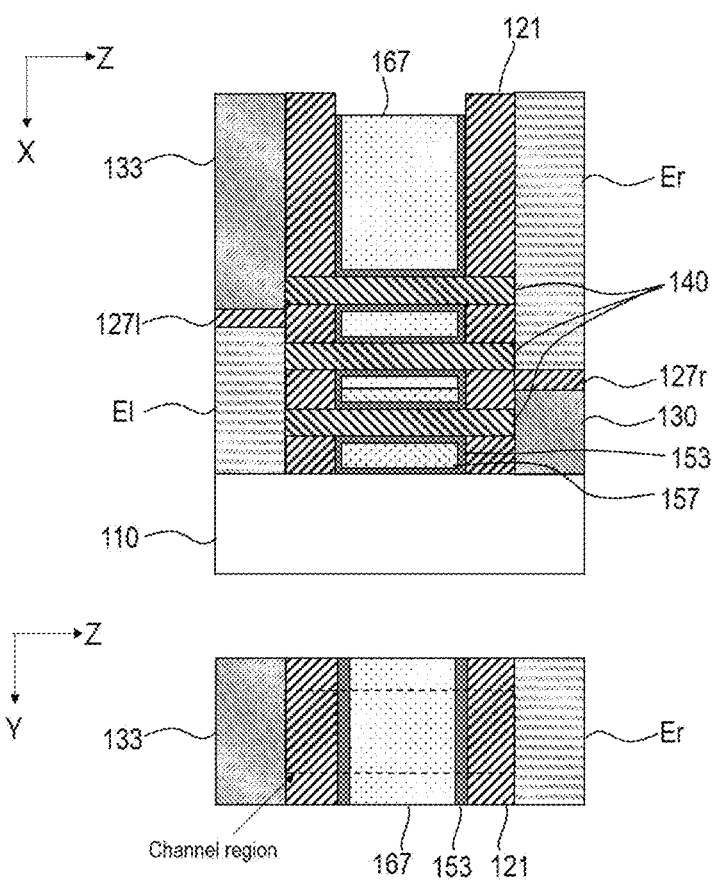
FIG. 19 is a three-dimensional cross-sectional view of the single structure CASCODE device according to the second embodiment of the present invention.

Specifically, referring to FIG. 19, the CASCODE device includes: a substrate 110; a plurality of channels 140 spaced from each other and arranged on the substrate in a vertical direction; source and drain regions 130 and 133 formed along side surfaces of the channels 140; and a replacement metal gate formed between each of the channels 140 and in a gate opening, wherein the replacement metal gate has a multilayer structure in which a gate oxide layer 153 and multiple work function metal layers 157 and 167 are stacked.

Each of the source and drain regions 130 and 133 have an epitaxial structure vertically elongated. At least one isolation insulating film 127r/127l is embedded in the epitaxial structure in a transverse direction, so that an upper portion and a lower portion of each epitaxial structure are isolated from each other by the isolation insulating film 127r or 127l.

The multiple work function metal layers 157 and 167 are formed such that two kinds of work function metal layers including a first work function metal layer 157 and a second work function metal layer 167 are formed in a lower region and an upper region of channel 140.

The equivalent circuit of this structure is the same as the circuit of FIG. 1 in which three transistors are connected in series. However, the number of transistors associated with each of the work function metal layers in the present embodiment differs from that of the structure of the previous embodiment. This structure increases both the voltage gain Gm and the output resistance Ro, thereby improving the intrinsic gain GmRo. Like the CASCODE device of FIG. 2, the two regions having different properties are formed in a single device. Therefore, the CASCODE device according of the present invention has a reduced gate length, thereby being formed in a smaller area. Therefore, the device size can be reduced, and analog/RF performance can be improved.

The CASCODE device of FIG. 19 may be manufactured by the similar method to that of FIGS. 3 to 18, except that a position where different work function metal layers are stacked is different.

Specifically, in the method of manufacturing the CASCODE device of FIG. 19, steps a) to n) are performed in the same manner. However, step n) is not performed in the same manner. That is, the work function metal layers are differently stacked.

That is, the work function metal layers 157 and 167 are stacked in a multilayer structure form in the gate opening and in the exposed channel regions. The second work function metal layer 167 formed in an upper channel region is associated with a larger number of channels than the number of channels associated with the first work function metal layer 157 formed in a lower channel region. More specifically, the first work function metal layer 157 is formed in the first lowermost channel and in a portion of the second lowermost channel, and the second work function metal layer 167 is formed in the remaining portion of the second channel region, the uppermost channel, and the gate opening.

Figure 20:
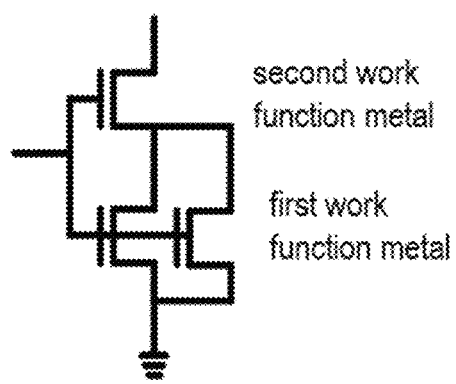
FIG. 20 is a circuitry diagram illustrating an equivalent circuit of a single structure CASCODE device according to a third embodiment of the present invention.

FIG. 20 is an equivalent circuitry diagram of a CASCODE device according to a third embodiment of the present invention. The CASCODE device is constructed from three transistors. Among the three transistors, two transistors are connected in series, and the other transistor is connected in parallel with the two transistors.

Figure 21:
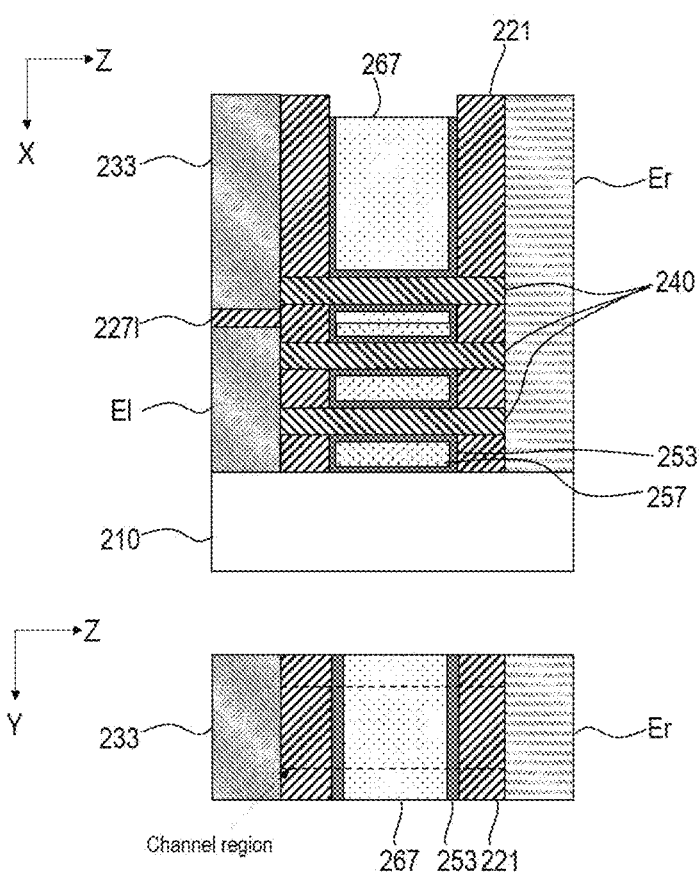
FIG. 21 is a three-dimensional cross-sectional view of the single structure CASCODE device according to the third embodiment of the present invention.
Figure 22:
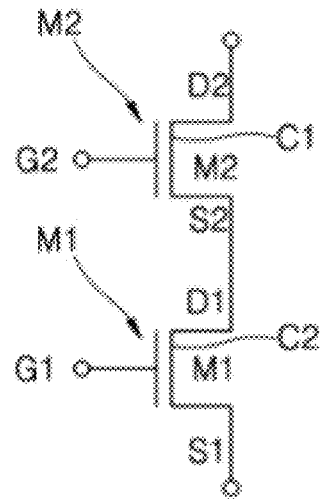
FIG. 22 is a circuitry diagram illustrating an equivalent circuit of a CASCODE according to a conventional art.
Figure 23A:
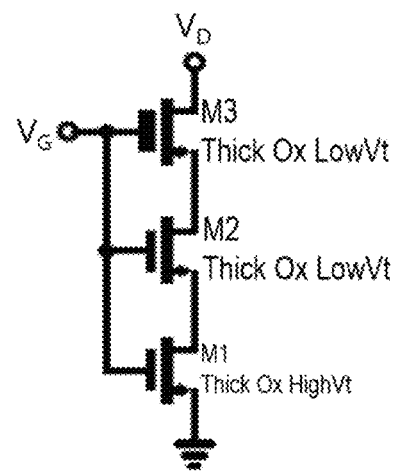
FIGS. 23A and 23B are a circuitry diagram and a cross-sectional view, respectively, illustrating the CASCODE circuit according to the conventional art.
Figure 23B:
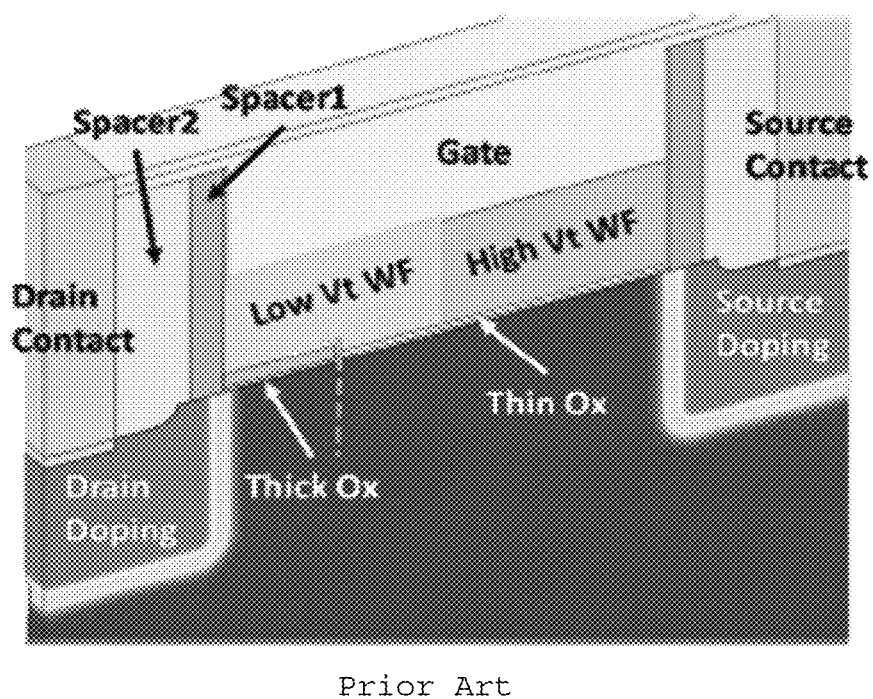

In the CASCODE device of FIG. 21 corresponding to the equivalent circuit of FIG. 20, an isolation insulating film 2271 is embedded in one of two epitaxial structures disposed at respective sides of the channel, and the other epitaxial structure does not have an isolation insulating film embedded therein. Thus, the other epitaxial structure has the advantage of increasing the channel width.

Specifically, referring to FIG. 21, the CASCODE device includes: a substrate 210; a plurality of channels 240 spaced from each other and arranged on the substrate in a vertical direction; source and drain regions 230 and 233 formed along side surfaces of the channels 240; a replacement metal gate formed between each of the channels and in a gate opening, the replacement metal gate having a multilayer structure in which a gate oxide layer 253 and multiple work function metal layers 257 and 267 having different work functions are stacked.

The source region 230 and the drain region 233 are arranged in a vertical direction on one side of the channel. The source region 230 and the drain region 233 are isolated from each other by an isolation insulating film 2271. The other side of the channel is provided with an epitaxial structure Er.

This structure has a combined connection in which three transistors are connected partially in series and partially in parallel unlike the equivalent circuit of the FIG. 1 in which three transistors are connected in series. This structure has the advantage of increasing both the voltage gain (Gm) and the maximum oscillation frequency (Fmax). This structure is also implemented in a single device like the CASCODE device of FIG. 2. Therefore, the CASCODE device according to the present embodiment has a reduced gate length and occupies a smaller area. Therefore, the device size can be reduced, and analog/RF performance can be improved.

The method of manufacturing the CASCODE device of FIG. 21 is the same as the method illustrated in FIGS. 3 to 18 except that an isolation insulating film 2271 is formed on one side of a channel.

Specifically, in the method of manufacturing the CASCODE device of FIG. 19, steps a) to n) are performed in the same manner. However, step f) is performed differently. That is, a lower insulating film and an upper insulating film are differently formed.

The method includes: forming a lower insulating film and an upper insulating film having different heights on the substrate 210 along a side surface of the insulating film 221 and a side surface of the channel 240 so as to correspond to a lower channel region and an upper channel region, respectively, and forming only the lower insulating film along the opposite side surface of the insulating film 221 and the opposite side surface of the channel 240;

etching the side surface of the lower insulating film and the side surface of the upper insulating film;

etching the lower insulating film so that the side surface of the channel 240 and the side surface of the insulating film 221 are exposed;

forming epitaxial structures on the substrate 210 on respective sides of the channel by performing a selective epitaxial growth process, in which one of the epitaxial structures is grown up to a lower end of the upper insulating film and the other epitaxial structure is grown up to an upper end of the upper insulating film;

removing the upper insulating film at one side of the channel and forming an isolation insulating film 2271 on the exposed lower insulating film; and forming an epitaxial structure on the isolation insulating film 2271 by performing an additional selective epitaxial growth process.

As a result, the source region 230 and the drain region 233 isolated by the isolation insulating film 2271 are present on the left side, and only the epitaxial structure Er is present on the right side.

In the CASCODE device, when the epitaxial structure is grown in a Y direction to form the source region and the drain region, the epitaxial structure may be formed to cover an upper end of the source region so that a metal contact cannot be connected to the drain region. Aside from this, the device can be connected to a metal wire disposed on a side surface of a shallow trench isolation (STI) structure by using a known buried power rail (BRP) technique.

As described above, in the single structure CASCODE device according to the present invention, the number of transistors connected in series may vary or the transistors are connected in parallel rather than in series, depending on the use of the CASCODE device. That is, the CASCODE device can be manufactured in various forms.

While the embodiments of the present invention have been described above with reference to the accompanying drawings, the present invention may be embodied in other specific forms without departing from the technical spirit or essential features of the present invention. Therefore, it should be understood that the embodiments described above are only for illustrative purposes in all respects and are not restrictive.

What is claimed is:

1. A single structure CASCODE device, comprising:
    a substrate;
    a plurality of channels spaced from each other and arranged on the substrate in a vertical direction;
    source and drain regions formed along first and second side surfaces of the plurality of channels;
    a replacement metal gate having a multilayer structure disposed between each of the plurality of channels and formed on a gate oxide layer,
    wherein in the source and drain regions, an upper portion and a lower portion arranged in a vertical direction are isolated from each other by at least one isolation insulating film transversely embedded therein, and
    wherein the replacement metal gate has the multilayer structure in which multiple work function metal layers are stacked on the gate oxide layer,
    wherein, among the multiple work function metal layers, a first work function metal layer formed in a lower channel region and a second work function metal layer formed in an upper channel region have different work functions.

2. The single structure CASCODE device according to claim 1, wherein a ratio of the multiple work function metal layers differs between the lower channel region and the upper channel region.

3. The single structure CASCODE device according to claim 1, wherein the source region and the drain region are linearly arranged on a first side or a second side of the plurality of channels, or arranged in on the first side and the second side of the plurality of channels, respectively.

4. The single structure CASCODE device according to claim 1, wherein the CASCODE device comprises multiple transistors that are connected in series or that are connected partially in series and partially in parallel.

5. The single structure CASCODE device according to claim 4, wherein each of the multiple transistors has a gate-all-around (GAA) structure.

6. The single structure CASCODE device according to claim 1, wherein the isolation insulating film is made of at least one insulating material selected from among $SiO_2$, $Al_2O_3$, $HfO_2$, $ZrO_2$, $Si_3N_4$, perovskite oxide, and combinations thereof.

7. The single structure CASCODE device according to claim 1, wherein the substrate is made of one or more materials selected from among silicon, germanium, tin, Group III compounds, Group IV compounds, Group V compounds, and heterogeneous compounds thereof.

8. The single structure CASCODE device according to claim 1, wherein the substrate is doped with one or more n-type impurities selected from among P, As, and Sb or one or more p-type impurities selected from among B, $BF_2$, Al, and Ga.

9. The single structure CASCODE device according to claim 8, wherein the impurities are doped in a concentration of $10^{19}$ $cm^{-3}$ or lower.

10. The single structure CASCODE device according to claim 1, further comprising a metal barrier disposed between the gate oxide layer and the first work function metal layer.

11. The single structure CASCODE device according to claim 1, further comprising a punch-through stopper underneath the plurality of channels.

12. A method of manufacturing a single structure CASCODE device, the method comprising:
    forming a plurality of channels spaced from each other and arranged in a vertical direction on a substrate;
    forming a source/drain region adjacent to the plurality of channels; and forming a replacement metal gate between each of the plurality of channels,
    wherein the source/drain region is formed to be in contact with a lower channel region or an upper channel region through a selective epitaxial growth (SEG) process, wherein a step of forming an isolation insulating film is performed at least one time during the forming the source/drain region, and
    the replacement metal gate is formed by performing an etching process to form a gate opening and to expose the plurality of channels, and forming a gate oxide layer and multiple work function metal layers between each of the plurality of channels and in the gate opening, wherein the multiple work function metal layers have different work functions to correspond to the lower channel region and the upper channel region.

13. The method according to claim 12, wherein a number of work function metal layers associated with the lower channel region is different from a number of work function metal layers associated with the upper channel region.

14. The method according to claim 12, wherein the forming of the source/drain region comprises:
    forming a lower insulating film and an upper insulating film that have different heights so as to correspond to the lower channel region and the upper channel region, respectively, the lower insulating film and the upper insulating film being disposed along a side surface of an insulating film and a side surface of each of the plurality of channels;
    etching a side surface of the lower insulating film and a side surface of the upper insulating film;
    etching a remaining lower insulating film to expose the side surface of each of the plurality of channels and the side surface of the insulating film;
    forming, on the substrate, a first epitaxial structure extending from the substrate to a lower end of the upper insulating film using a SEG process;
    removing the upper insulating film and forming the isolation insulating film on the lower insulating film; and
    forming a second epitaxial structure on the isolation insulating film using a SEG process.

15. The method according to claim 12, wherein the forming of the source/drain region comprises:
    forming a lower insulating film and an upper insulating film that have different heights so as to correspond to the lower channel region and the upper channel region, respectively, the lower insulating film and the upper insulating film being disposed along a side surface of an insulating film and a side surface of each of the plurality of channels, and forming only the lower insulating film along the opposite side surface of each of the plurality of channels;

etching a side surface of the lower insulating film and a side surface of the upper insulating film;

etching a remaining lower insulating film such that the side surface of each of the plurality of channels and the side surface of the insulating film are exposed;

forming, using a SEG process, epitaxial structures at both sides of the plurality of channels, wherein one of the epitaxial structures extends from the substrate to a lower end of the upper insulating film and another one of the epitaxial structures extends from the substrate to an upper end of the upper insulating film;

removing the upper insulating film formed at one side of the plurality of channels and forming the isolation insulating film on the lower insulating film; and forming an epitaxial structure on the isolation insulating film using a SEG process.

16. The method according to claim 12, further comprising forming a metal barrier on the gate oxide layer.

17. The method according to claim 12, further comprising forming a punch-through stopper.

* * * * *